(12) United States Patent
Katsube (10) Patent No.: US 11,596,063 B2
(45) Date of Patent: Feb. 28, 2023

(54) COMPOSITE SUBSTRATE AND METHOD FOR MANUFACTURING COMPOSITE SUBSTRATE

(71) Applicant: Murata Manufacturing Co., Ltd., Nagaokakyo (JP)

(72) Inventor: Tsuyoshi Katsube, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

(21) Appl. No.: 17/154,328

(22) Filed: Jan. 21, 2021

(65) Prior Publication Data

US 2021/0144850 A1  May 13, 2021

Related U.S. Application Data

(63) Continuation of application No. PCT/JP2019/027728, filed on Jul. 12, 2019.

(30) Foreign Application Priority Data

Jul. 25, 2018  (JP) .............................. JP2018-139436

(51) Int. Cl.
*H05K 1/03* (2006.01)
*H05K 1/02* (2006.01)
*H05K 1/11* (2006.01)
*H05K 3/46* (2006.01)

(52) U.S. Cl.
CPC ........... *H05K 1/036* (2013.01); *H05K 1/0298* (2013.01); *H05K 1/0306* (2013.01); *H05K 1/115* (2013.01); *H05K 3/4688* (2013.01); *H05K 1/11* (2013.01)

(58) Field of Classification Search
CPC .... H05K 1/036; H05K 1/0298; H05K 1/0306; H05K 1/115; H05K 3/4688; H05K 1/0373; H05K 3/0029; H05K 3/0032; H05K 3/4697; H05K 2203/308
See application file for complete search history.

(56) References Cited

U.S. PATENT DOCUMENTS

| 7,446,262 B2 * | 11/2008 | Ogawa ..................... H01L 23/13 |
|---|---|---|
| | | 174/255 |
| 9,937,798 B2 | 4/2018 | Matsumura |
| 10,499,506 B2 | 12/2019 | Hanao et al. |

(Continued)

FOREIGN PATENT DOCUMENTS

| JP | H07273470 A | 10/1995 |
|---|---|---|
| JP | 2003304064 A | 10/2003 |

(Continued)

OTHER PUBLICATIONS

International Search Report issued for PCT/JP2019/027728, dated Sep. 17, 2019.

(Continued)

*Primary Examiner* — Ishwarbhai B Patel
(74) *Attorney, Agent, or Firm* — ArentFox Schiff LLP (57) ABSTRACT

A composite substrate that includes: an upper ceramic layer; a lower ceramic layer; a middle resin layer between the upper ceramic layer and the lower ceramic layer; and a side surface resin layer on all side surfaces of the composite substrate, wherein the middle resin layer and the side surface resin layer are integral resin layers.

13 Claims, 4 Drawing Sheets

A-A line cross-sectional view (56) References Cited

U.S. PATENT DOCUMENTS

| | | | |
|---|---|---|---|
| 2002/0189859 A1* | 12/2002 | Shiraishi | H01L 23/49822 29/846 |
| 2005/0263880 A1* | 12/2005 | Igarashi | H01L 23/3735 257/E23.173 |
| 2007/0009718 A1* | 1/2007 | Kanda | H05K 3/4608 428/209 |
| 2011/0024167 A1* | 2/2011 | Hashimoto | H05K 3/4688 29/846 |
| 2017/0019990 A1* | 1/2017 | Takemura | G01R 1/07342 |
| 2017/0072802 A1 | 3/2017 | Matsumura | |
| 2018/0376594 A1 | 12/2018 | Hanao et al. | |

FOREIGN PATENT DOCUMENTS

| | | | |
|---|---|---|---|
| JP | 2007317711 A | 12/2007 | |
| WO | 2017048805 A1 | 3/2017 | |
| WO | 2017154692 A1 | 9/2017 | |

OTHER PUBLICATIONS

Written Opinion of the International Searching Authority issued for PCT/JP2019/027728, dated Sep. 17, 2019.

\* cited by examiner

A-A line cross-sectional view

COMPOSITE SUBSTRATE AND METHOD FOR MANUFACTURING COMPOSITE SUBSTRATE

CROSS REFERENCE TO RELATED APPLICATIONS

The present application is a continuation of International application No. PCT/JP2019/027728, filed Jul. 12, 2019, which claims priority to Japanese Patent Application No. 2018-139436, filed Jul. 25, 2018, the entire contents of each of which are incorporated herein by reference.

FIELD OF THE INVENTION

The present invention relates to a composite substrate and a method of producing a composite substrate.

BACKGROUND OF THE INVENTION

Substrates for mobile communication modules are required to have a reduced size, reduced height, and low transmission loss as higher frequency bands are used for mobile communication devices such as smartphones.

A technique to achieve such reduction in size, height, and transmission loss suggested in Patent Literature 1 (WO 2017/048805) is to form a resin layer having a low permittivity in a ceramic multilayer substrate.

SUMMARY OF THE INVENTION

Such a ceramic multilayer substrate including a resin layer as described in Patent Literature 1, however, has the interface between the resin layer and a ceramic layer exposed on side surfaces of the substrate. Thus, the adhesive strength in the interface between the resin layer and the ceramic layer is insufficient, which problematically causes peeling between the resin layer and the ceramic layer due to shock and/or impact during processing or thermal shock in reflowing.

The present invention was made to solve the above problem and aims to provide a composite substrate in which the resin layer and the ceramic layer, adhering to each other, tend not to peel from each other.

A composite substrate according to one embodiment of the present invention to achieve the above aim is a composite substrate including: an upper ceramic layer; a lower ceramic layer; a middle resin layer between the upper ceramic layer and the lower ceramic layer; and a side surface resin layer on all side surfaces of the composite substrate, wherein the middle resin layer and the side surface resin layer are integral resin layers.

A method of producing a composite substrate according to one embodiment of the present invention includes: preparing a laminate in which a cavity-forming sheet made of a cavity-forming material is sandwiched between ceramic green sheets made of a raw ceramic material; firing the laminate to sinter the raw ceramic material into a substrate having an upper ceramic layer and a lower ceramic layer and to cause the cavity-forming material to burn off to form a cavity between the upper ceramic layer and the lower ceramic layer; immersing the substrate with the cavity in a liquid containing a resin material to cause the resin material to adhere to the cavity and all side surfaces of the substrate; and curing the resin material to form a middle resin layer between the upper ceramic layer and the lower ceramic layer and a side surface resin layer entirely on all side surfaces of the substrate.

The present invention can provide a composite substrate in which the resin layer and the ceramic layer, adhering to each other, tend not to peel from each other.

DETAILED DESCRIPTION OF THE PREFERRED EMBODIMENTS

The composite substrate of the present invention and the production method thereof are described below.

The present invention is not limited to the following preferred embodiments, and may be suitably modified without departing from the gist of the present invention. Combinations of two or more preferred features described in the following preferred embodiments are also within the scope of the present invention.

Composite Substrate

A composite substrate according to one embodiment of the present invention includes: an upper ceramic layer; a lower ceramic layer; and a middle resin layer sandwiched between the upper ceramic layer and the lower ceramic layer, a side surface resin layer being provided on at least one side surface of the composite substrate, the middle resin layer and the side surface resin layer are integral resin layers.

In the composite substrate according to one embodiment of the present invention, the middle resin layer is sandwiched between the upper ceramic layer and the lower ceramic layer.

The middle resin layer functions as a stress relieving layer. Thus, use of the middle resin layer can increase the strength against shock and/or impact.

Here, since at least one side surface of the composite substrate is covered by the side surface resin layer, the interface between the middle resin layer and the ceramic layer is not exposed, which reduces the chances of peeling.

In addition, since the middle resin layer and the side surface resin layer are integral resin layers, peeling between the ceramic layer and the middle resin layer can be further reduced or prevented.

The expression "the middle resin layer and the side surface resin layer are integral resin layers" means a state where the middle resin layer and the side surface resin layer are made of the same type of resin and no interface is present between the middle resin layer and the side surface resin layer.

An example of the structure of the composite substrate of the present invention is described with reference to FIG. 1 and FIG. 2.

Figure 1:
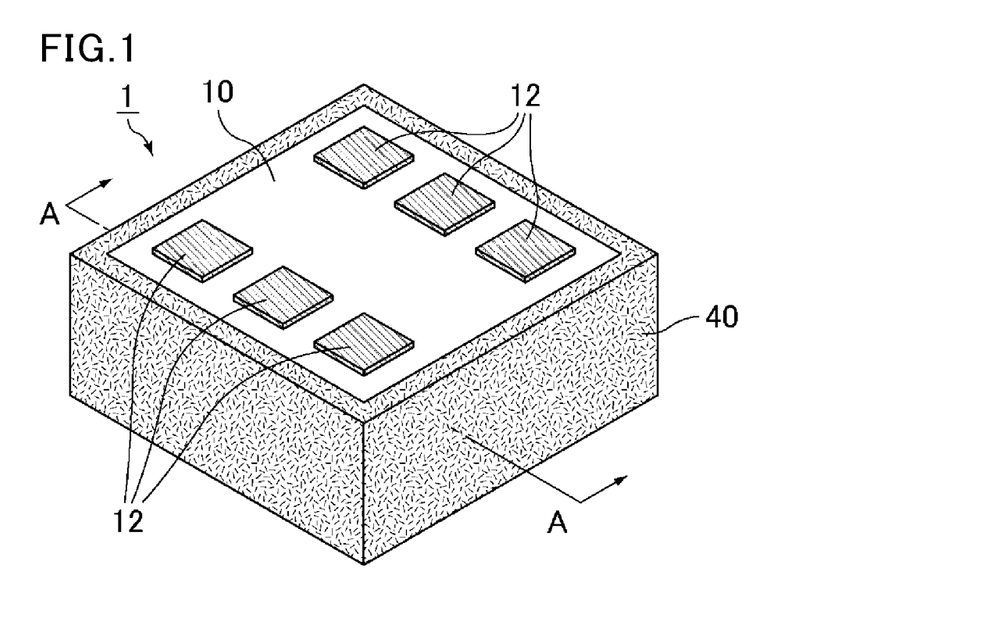
FIG. 1 is a perspective view schematically showing an example of the composite substrate of the present invention.

FIG. 1 is a perspective view schematically showing an example of the composite substrate of the present invention.

Figure 2:
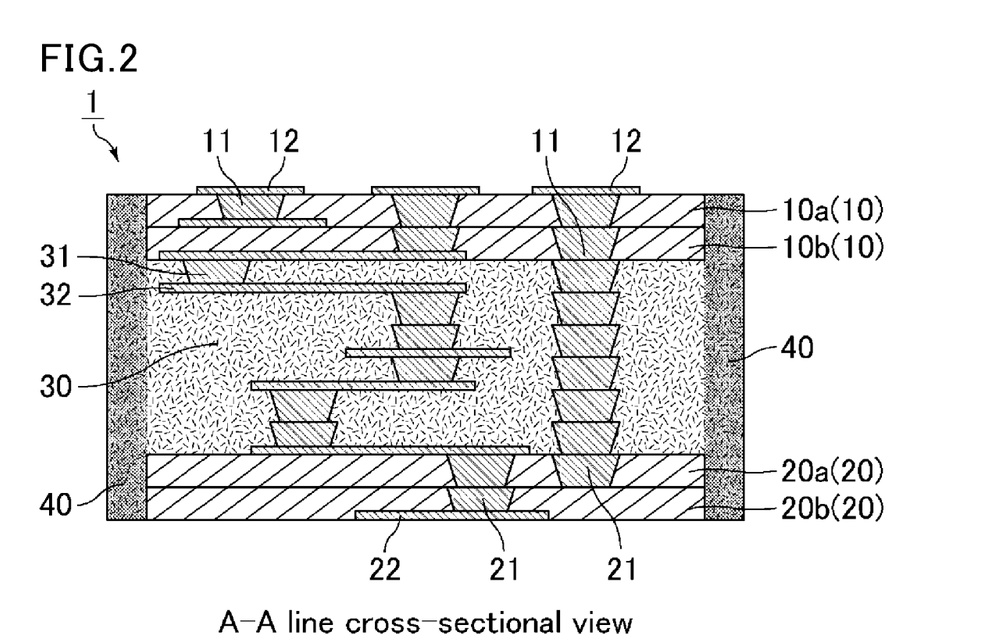
FIG. 2 is a cross-sectional view taken along the A-A line in FIG. 1.

FIG. 2 is a cross-sectional view taken along the A-A line in FIG. 1.

As shown in FIG. 1 and FIG. 2, a composite substrate 1 of the present invention includes an upper ceramic layer 10, a lower ceramic layer 20, a middle resin layer 30 provided between the upper ceramic layer 10 and the lower ceramic layer 20, and a side surface resin layer 40 provided on the side surfaces of the composite substrate 1. Also, the middle resin layer 30 and the side surface resin layer 40 are integral resin layers.

FIG. 2 shows the regions corresponding to the side surface resin layer 40 in a darker color than the middle resin layer 30 for convenience of description. In an actual composite substrate, there is no boundary between the middle resin layer and the side surface resin layer.

The upper ceramic layer 10 is provided with upper conductive lines 12 and upper vias 11. The lower ceramic layer 20 is provided with lower conductive lines 22 and lower vias 21. The middle resin layer 30 is provided with middle conductive lines 32 and middle vias 31.

In the composite substrate 1, the middle resin layer 30 is sandwiched between the upper ceramic layer 10 and the lower ceramic layer 20. The middle resin layer 30 functions as a stress relieving layer. Thus, use of the middle resin layer can increase the strength against shock and/or impact. Since the side surfaces of the composite substrate 1 are covered by the side surface resin layer 40, the interfaces between the middle resin layer 30 and the upper ceramic layer 10 and between the middle resin layer 30 and the lower ceramic layer 20 are not exposed, which reduces the chances of peeling.

In addition, since the middle resin layer 30 and the side surface resin layer 40 are integral resin layers, peeling between the upper ceramic layer 10 and the middle resin layer 30 and peeling between the lower ceramic layer 20 and the middle resin layer 30 can be further reduced or prevented.

The right side of FIG. 2 shows an example in which upper vias 11, middle vias 31, and a lower via 21 are aligned in the thickness direction and joined together into a columnar metal conductor.

The left side of FIG. 2 shows upper conductive lines 12 formed in the direction of the plane of the upper ceramic layer 10, middle conductive lines 32 formed in the direction of the plane of the middle resin layer 30, and a lower conductive line 22 formed in the direction of the plane of the lower ceramic layer 20, and shows an example in which upper vias 11, middle vias 31, and lower vias 21 are joined with the upper conductive lines 12, the middle conductive lines 32, and/or the lower conductive line 22.

Herein, the concept that upper vias, middle vias, and lower vias are joined together is not limited to the structure shown in the right side of FIG. 2 in which the vias are aligned in the thickness direction and formed into a columnar metal conductor. The concept encompasses a structure in which upper vias, middle vias, and lower vias are joined and connected by upper conductive lines, middle conductive lines, and lower conductive lines formed in the direction of the planes, as shown in the left side of FIG. 2.

The upper ceramic layer 10 and the lower ceramic layer 20 are made of a sintered ceramic material.

The ceramic material preferably includes a low-temperature sintering ceramic material.

The low-temperature sintering ceramic material means a ceramic material sinterable at a firing temperature of 1000° C. or lower and capable of being co-fired with silver or copper which are preferable as metal materials.

Specifically, the low-temperature sintering ceramic material can be a glass composite-based low-temperature sintering ceramic material in which a ceramic material such as quartz, alumina, or forsterite is mixed with borosilicate glass; a crystallized glass-based low-temperature sintering ceramic material containing $ZnO$—$MgO$—$Al_2O_3$—$SiO_2$-based crystallized glass; or a non-glass low-temperature sintering ceramic material containing a $BaO$—$Al_2O_3$—$SiO_2$-based ceramic material or a $Al_2O_3$—$CaO$—$SiO_2$—$MgO$—$B_2O_3$-based ceramic material.

Although FIG. 1 and FIG. 2 show an embodiment in which a plurality of upper ceramic layers 10 and a plurality of lower ceramic layers 20 are provided, the structure is sufficient as long as at least one upper ceramic layer and at least one lower ceramic layer are provided on the top and bottom of the middle resin layer, respectively, such that the middle resin layer is sandwiched between at least one upper ceramic layer and at least one lower ceramic layer.

The upper ceramic layer and the lower ceramic layer are also referred to collectively as the upper and lower ceramic layers.

The middle resin layer 30 may be made of any resin material having a feature and/or function desired to be imparted to the composite substrate. Preferred examples of the resin material include fluororesin, silicone rubber, and hydrocarbon resin with less polar groups (e.g., polyethylene, polypropylene, polystyrene). More preferred examples include a fluororesin having relative permittivity $\varepsilon_r \approx 2.6$, silicone rubber having relative permittivity $\varepsilon_r \approx 3.0$, polyethylene having relative permittivity $\varepsilon_r \approx 2.25$, polypropylene having relative permittivity $\varepsilon_r \approx 2.2$, and polystyrene having relative permittivity $\varepsilon_r \approx 2.45$.

These resin materials have a low permittivity, and are therefore suitable as the resin material defining the middle resin layer provided to reduce the transmission loss in high frequency ranges.

Voids are preferably present in the middle resin layer. Also, a void-forming material such as hollow beads is preferably contained in the middle resin layer. It is also preferred that voids are present and a void-forming material is contained in the middle resin layer.

Voids and a void-forming material present in the middle resin layer can lead to a decrease in permittivity of the middle resin layer, and are therefore suitable for the middle resin layer provided to reduce the transmission loss in high frequency ranges.

The relative permittivity $\varepsilon_r$ of the middle resin layer is preferably 1.5 to 3.

The relative permittivity of the middle resin layer is not of the resin material but of the whole middle resin layer, and thus any other insulating materials in the middle resin layer, such as voids, a void-forming material, and fillers, if present, contribute to the relative permittivity.

Also, the middle resin layer containing a void-forming material can reduce the difference in coefficient of thermal expansion between the middle resin layer and the upper and lower ceramic layers, improving the heat cycle characteristics.

The void-forming material can also be hollow beads.

Examples of the hollow beads include those each having a shell layer, mainly containing at least one inorganic material selected from the group consisting of $SiO_2$, $Al_2O_3$, $ZrO_2$, $TiO_2$, and $MgO$, and a hollow core in the shell layer. A shell layer mainly containing $SiO_2$ is preferred. Also, hollow beads of closed-shell type are preferred in each of which the hollow portion is completely surrounded by the shell layer.

The proportion of the void-forming material in the middle resin layer is preferably 20 vol % or more, more preferably 40 vol % or more.

The resin material can also preferably be a resin material having a low tensile elastic modulus, such as a fluororesin, polyimide-based resin, polyether ketone-based resin, polyphenylene sulfide-based resin, or cycloolefin-based resin.

More preferably, the resin material can be a fluororesin having tensile elastic modulus E (GPa) 0.39 or more and 0.55 or less or a cycloolefin-based resin having tensile elastic modulus E (GPa) 2.1 or more and 2.2 or less.

These resin materials have a low tensile elastic modulus and are therefore suitable as the resin material defining the middle resin layer that functions as a stress relieving layer against shock and/or impact.

The tensile elastic modulus of the middle resin layer is preferably 3 GPa or less. The tensile elastic modulus of the middle resin layer is more preferably 1 GPa or less.

The tensile elastic modulus of the middle resin layer is preferably 0.02 GPa or more.

The middle resin layer can also be made of a material such as a rubber-based material or a thermoplastic elastomer (e.g., vinyl chloride-, styrene-, olefin-, ester-, urethane-, or amide-based one).

The tensile elastic modulus of the middle resin layer is not of the resin material but of the whole middle resin layer.

The thickness of the middle resin layer is preferably, but not limited to, greater than the total thickness of the upper ceramic layer and the lower ceramic layer, more preferably 50% to 80% of the thickness of the composite substrate.

The thickness of each of the upper ceramic layer and the lower ceramic layer is preferably, but not limited to, less than 50% of the thickness of the composite substrate.

The thickness of the upper ceramic layer and the thickness of the lower ceramic layer may be different from each other but are preferably the same as each other.

The upper ceramic layer and the lower ceramic layer of the same thickness can reduce or prevent warpage of the composite substrate due to volume changes in firing.

The thickness of the side surface resin layer (the distance in the direction of the plane of the composite substrate) is preferably, but not limited to, 20 to 100 μm.

The side surface resin layer has only to be provided on at least one side surface of the composite substrate but is preferably provided on two or more side surfaces, more preferably on all the side surfaces of the composite substrate, in a front view of the composite substrate from the upper ceramic layer side or lower ceramic layer side.

The thickness of the side surface resin layer may or may not be uniform at every site.

In FIG. 2, the middle vias 31, the upper vias 11, and the lower vias 21 are joined together.

The middle vias 31, the upper vias 11, and the lower vias 21 are each preferably made of a mixture of a metal material and a ceramic material.

The metal material preferably contains at least one selected from gold, silver, and copper, and more preferably contains silver or copper. Gold, silver, and copper have low resistance and are therefore especially suitable for composite substrates for use at high frequencies.

As for the ceramic material, the same ceramic material as that defining the upper and lower ceramic layers can be suitably used. Use of the same ceramic material can equalize the sintering behavior of the ceramic material defining the upper and lower ceramic layers and the sintering behavior of a metal conductor paste.

The proportion of the metal material in the material of middle vias is preferably 40 wt % to 99 wt %, more preferably 60 wt % to 90 wt %. The proportion of the metal material in the material of middle vias of 99 wt % or less means that the middle via in the middle resin layer is different from a metal conductor having a composition consisting of a metal and formed by a method such as plating, which is a method of forming a metal conductor often used for resin substrates. As described below, although a metal conductor can be formed by firing a metal conductor paste, such a metal conductor produced through firing of a metal conductor paste contains materials other than the metal material, such as a ceramic material, meaning that such a metal conductor does not have a composition consisting of a metal material. A metal conductor formed through firing of a metal conductor paste can achieve a stronger junction than a metal conductor made only of a metal material and formed by a method such as plating without firing, thereby further improving the connection reliability.

The proportion of the metal material in each of the material of upper vias and the material of lower vias is preferably 40 wt % to 99 wt %, more preferably 60 wt % to 90 wt %, as in the middle via.

The proportion of the metal material in each of the material of upper vias and the material of lower vias of 40 wt % or more is preferred because the resistance of the composite substrate is not excessively high.

The middle vias, the upper vias, and the lower vias preferably have the same composition. Co-firing metal conductor pastes having the same composition to form metal conductors imparts the same composition to the middle vias, the upper vias, and the lower vias.

Compositions that are not the same as each other but similar to each other are also preferred as they impart similar characteristics to the upper vias, the middle vias, and the lower vias. Specifically, the difference between the proportion (wt %) of the metal material in the material of middle vias and the proportion (wt %) of the metal material in each of the material of upper vias and the material of lower vias is preferably 59 wt % or less. A difference of 30 wt % or less is more preferred because the interfacial characteristics of the vias can be equalized. The lower limit of the difference is 0 wt % (the compositions of the vias are the same), and the lower limit may be 0.001 wt % (the difference is 0.001 wt % or more).

The middle conductive lines in the middle resin layer may be formed in different layers. Although the middle resin layer as an insulating layer defining the middle resin layer is a single layer because it is formed by single resin immersion as described below, the middle vias may be stacked in multiple stages and the middle conductive line formed in the direction of the plane may also be stacked in multiple layers. The composite substrate 1 in FIG. 2 is an example in which six layers of conductive lines are formed in the middle resin layer 30.

Although FIG. 2 shows the "upper ceramic layer-middle resin layer-lower ceramic layer" structure in which a single middle resin layer is provided, a plurality of middle resin layers may be provided as long as the middle resin layers are sandwiched between the upper and lower ceramic layers. For example, a layer structure "upper ceramic layer-first middle resin layer-central ceramic layer-second middle resin layer-lower ceramic layer" is encompassed by the composite substrate of the present invention.

When a central ceramic layer is formed and the central ceramic layer completely separates the first middle resin layer and the second middle resin layer, the thickness of the central ceramic layer is not taken into the thickness of the middle resin layer. Meanwhile, when the central ceramic layer does not completely separate the first middle resin layer and the second middle resin layer, the thicknesses of the first middle resin layer, the central ceramic layer, and the second middle resin layer are taken as the thickness of the middle resin layer.

The composite substrate of the present invention may have in the middle resin layer an insulating strut structure that connects the upper ceramic layer and the lower ceramic layer.

Figure 3:
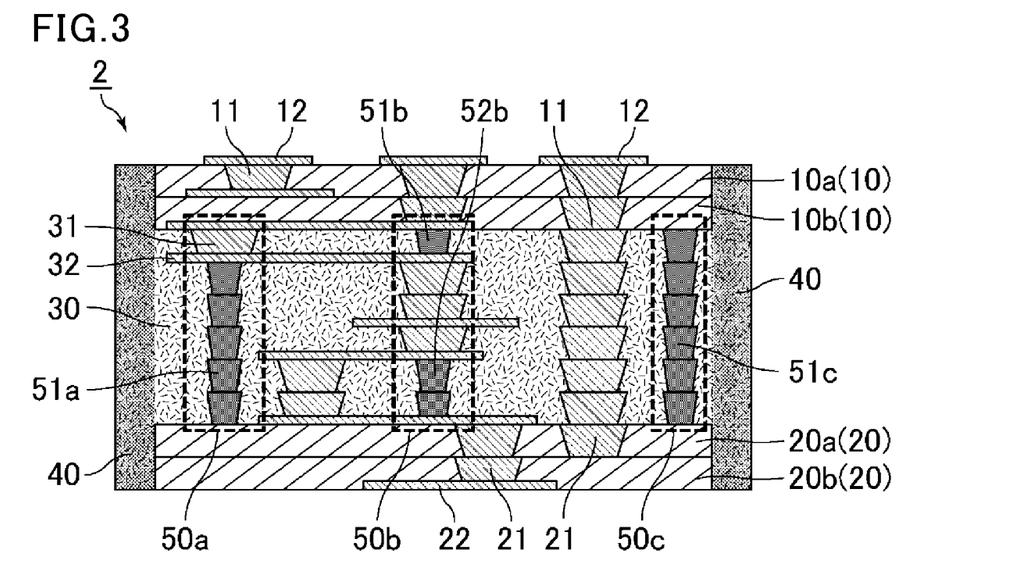
FIG. 3 is a cross-sectional view of another example of the composite substrate of the present invention.

In the strut structure, an insulating columnar support extending in the thickness direction of the middle resin layer defines at least part of the strut structure. This structure is described with reference to FIG. 3. FIG. 3 is a cross-sectional view schematically showing another example of the composite substrate of the present invention.

A composite substrate 2 shown in FIG. 3 has insulating strut structures 50a, 50b, and 50c each connecting the upper ceramic layer 10 and the lower ceramic layer 20 in the respective regions indicated by dashed lines in the middle resin layer 30.

The strut structure 50a is defined by insulating supports 51a connecting a lower ceramic layer 20a and a middle conductive line 32, a middle conductive line 32 over the supports 51a, and a middle via 31 between the middle conductive line 32 and the upper ceramic layer 10.

The strut structure 50b is defined by middle vias 31 and middle conductive lines 32 in the middle resin layer 30, insulating supports 52b under them (between them and a middle conductive line 32 immediately above the lower ceramic layer 20a), and an insulating support 51b over them (between them and an upper ceramic layer 10b).

The strut structure 50c is defined only by insulating supports 51c provided in the middle resin layer 30 and between the upper ceramic layer 10b and the lower ceramic layer 20a.

Provision of the strut structures as above in the middle resin layer can prevent deformation of the substrate due to the hollow structure formed in the laminate (substrate) after firing, prior to resin immersion for middle resin layer formation. Also, after the formation of the middle resin layer, provision of such strut structures can enhance the mechanical strength of the composite substrate in the thickness direction.

The supports may be made of any insulating material such as the same material as the upper and lower ceramic layers or a ceramic or glass material having insulation of the same level as the upper and lower ceramic layers.

The position, thickness, and number of supports to be provided in the middle resin layer can be adjusted as appropriate depending on the shapes and patterns of the middle vias and middle conductive lines defining the middle resin layer.

In the composite substrate of the present invention, not only the side surfaces of the substrate but also a surface of one of the upper and lower ceramic layers may be covered by the same resin as the middle resin layer and the side surface resin layer.

Figure 4:
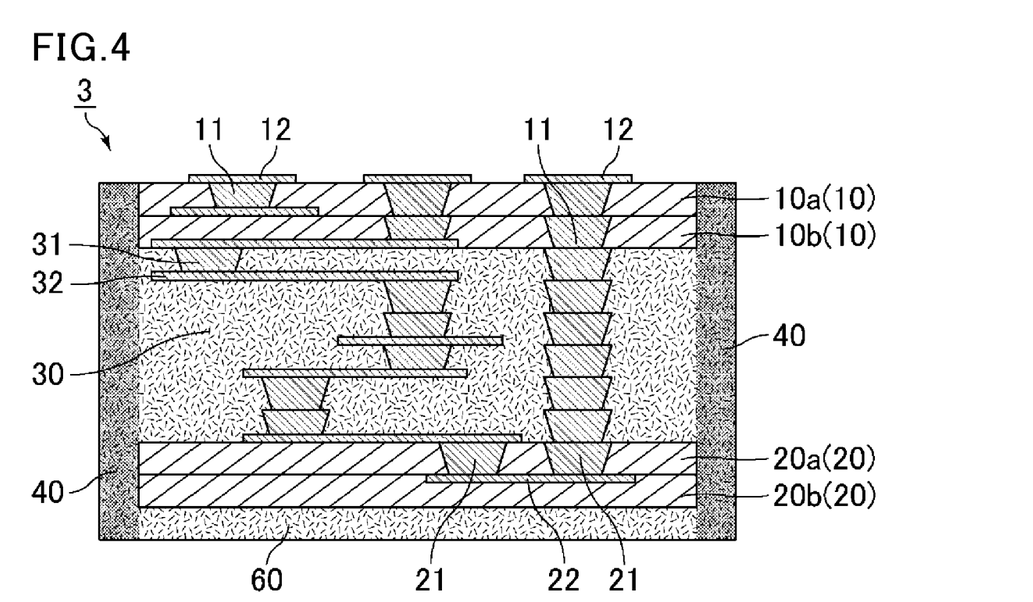
FIG. 4 is a cross-sectional view schematically showing yet another example of the composite substrate of the present invention.

FIG. 4 is a cross-sectional view schematically showing yet another example of the composite substrate of the present invention.

A composite substrate 3 shown in FIG. 4 includes the upper ceramic layer 10, the lower ceramic layer 20, and the middle resin layer 30 between the upper ceramic layer 10 and the lower ceramic layer 20, the side surface resin layer 40 on side surfaces of the composite substrate, where the middle resin layer 30 and the side surface resin layer 40 are integral resin layers. In addition, a surface resin layer 60 is provided on the bottom surface (the surface of the lower ceramic layer 20b not in contact with the lower ceramic layer 20a, i.e., the surface of the lower ceramic layer 20 not in contact with the middle resin layer 30) of the lower ceramic layer 20, and the surface resin layer 60 is integral with the side surface resin layer 40 and the middle resin layer 30.

With the bottom surface of the lower ceramic layer 20 covered with the surface resin layer 60, the composite substrate has even higher mechanical strength.

Although FIG. 4 shows the case where lower conductive lines to function as the electrodes are not provided on the bottom surface of the lower ceramic layer, the surface resin layer has only to cover one of the surfaces of a ceramic layer and may be provided on the top surface of the upper ceramic layer.

For example, when no upper conductive line to function as an electrode is provided on the top surface of the upper ceramic layer and a lower conductive line to function as an electrode is provided on the bottom surface of the lower ceramic layer, the top surface of the upper ceramic layer may be covered with the surface resin layer.

Method of Producing Composite Substrate

The method of producing a composite substrate of the present invention includes: preparing a laminate in which a cavity-forming sheet made of a cavity-forming material is sandwiched between ceramic green sheets made of a raw ceramic material; firing the laminate to sinter the raw ceramic material into an upper ceramic layer and a lower ceramic layer and cause the cavity-forming material to burn off to form a cavity between the upper ceramic layer and the lower ceramic layer; forming a middle resin layer between the upper ceramic layer and the lower ceramic layer and a side surface resin layer on at least one side surface of the substrate by immersing the substrate with the cavity in a liquid containing a resin material to cause the resin material to adhere to the cavity and the at least one side surface of the substrate; and curing the resin material.

According to the method of producing a composite substrate of the present invention, the firing sinters the raw ceramic material defining the ceramic green sheets and causes the cavity-forming material to burn off to form a cavity.

The resin layer forming step forms a side surface resin layer on at least one side surface of the composite substrate, so that the interface between the middle resin layer and the ceramic layer is not exposed, and thus peeling can be reduced or prevented.

In addition, the curing step cures the same resin material to obtain a middle resin layer and a side surface resin layer, so that the middle resin layer and the side surface resin layer are integral resin layers. Thus, the side surface resin layer does not peel from the side surface of the composite substrate, and thus peeling between the ceramic layer and the middle resin layer can be further reduced or prevented. The middle resin layer and the side surface resin layer may be cured simultaneously.

An example of the method of producing a composite substrate of the present invention is described with reference to FIG. 5A, FIG. 5B, FIG. 5C, and FIG. 5D.

FIG. 5A, FIG. 5B, FIG. 5C, and FIG. 5D are each a cross-sectional view schematically showing a step in the method of producing a composite substrate of the present invention. The first step is the laminate preparing step of preparing a laminate in which a cavity-forming sheet is sandwiched between ceramic green sheets.

First, ceramic green sheets are prepared.

Each ceramic green sheet is obtained by molding a ceramic slurry as the raw ceramic material into a sheet shape by a method such as the doctor blade method. The ceramic slurry contains powder of a glass ceramic obtained by mixing alumina and borosilicate glass or powder as a material of a Ba—Al—Si—O-based ceramic that produces a glass component during firing, an organic binder, and a solvent. The ceramic slurry may contain additives such as a dispersant and a plasticizer.

Examples of the organic binder include butyral resin (polyvinyl butyral), acrylic resin, and methacrylic resin. Examples of the solvent include toluene and an alcohol such as isopropyl alcohol. Examples of the plasticizer include di-n-butyl phthalate.

The ceramic green sheet is drilled by laser or mechanical punching, and the resulting holes are filled with a metal conductor paste for interlayer connection. Also, using the metal conductor paste, conductive lines and electrodes are formed by a method such as screen printing.

The metal conductor paste can suitably be a paste containing any of the metal materials described above and a ceramic material defining the ceramic layers. The metal conductor paste preferably contains a solvent, an organic binder, and the like.

The metal conductor paste preferably contains a metal material such that the proportion of the metal material in the metal conductor after firing is 40 wt % or more and 99 wt % or less.

Through the above processes are produced ceramic green sheets made of a raw ceramic material and containing the metal conductor paste for interlayer connection.

Separately, a cavity-forming sheet is prepared.

The cavity-forming sheet is made of a cavity-forming material, which is a material that burns off in the subsequent firing step to form a cavity in the portion where the material was present, and contains a metal conductor paste for interlayer connection.

The cavity-forming material is preferably a material whose weight reduction ratio after one-hour firing at the sintering start temperature of the metal conductor paste in the cavity-forming sheet is 10% or less and whose weight reduction ratio after one-hour firing at the firing temperature in the firing step is 99% or higher.

Also, the cavity-forming material preferably burns off at the firing temperature (preferably, 800° C. or higher and 1000° C. or lower) or lower, specifically more preferably at 850° C. or higher and 950° C. or lower.

The cavity-forming material is preferably carbon. A carbon sheet can be preferably used as a cavity-forming sheet.

The carbon sheet can be obtained by adding an organic binder, a dispersant, and a plasticizer to carbon, mixing and pulverizing them to obtain a slurry, forming the slurry into a sheet shape on a base film by the doctor blade method, and drying the slurry.

The thickness of the cavity-forming sheet may be set as appropriate according to the thickness of the cavity to be formed after the firing step, and is preferably 5 μm or more and 100 μm or less, more preferably 5 μm or more and 50 μm or less.

A commercially available carbon sheet (graphite sheet) can also be used.

As with the ceramic green sheets, the cavity-forming sheet is drilled by laser or mechanical punching, and the resulting holes are filled with a metal conductor paste for interlayer connection. Also, using the metal conductor paste, conductive lines and electrodes are formed by a method such as screen printing.

The metal conductor paste is preferably the same as the metal conductor paste used to produce the ceramic green sheets.

The metal conductor paste preferably contains a metal material such that the proportion of the metal material in the metal conductor after firing is 40 wt % or more and 99 wt % or less.

When a metal conductor paste different from the metal conductor paste used to produce the ceramic green sheets is used, a metal conductor paste is preferably used which provides a difference between the proportion (wt %) of the metal material in the metal conductor paste used to produce the ceramic green sheets and the proportion (wt %) of the metal conductor paste used to produce the cavity-forming sheet of 59 wt % or less.

After the drilling, the holes in the cavity-forming sheet may be filled with a ceramic paste having the same composition as the ceramic paste used to produce the ceramic green sheets.

Filling the holes in the drilled cavity-forming sheet with a ceramic paste allows formation of supports defining strut structures in the middle resin layer.

Subsequently, the ceramic green sheets and the cavity-forming sheet are stacked such that the cavity-forming sheet is sandwiched between the ceramic green sheets.

Figure 5A:
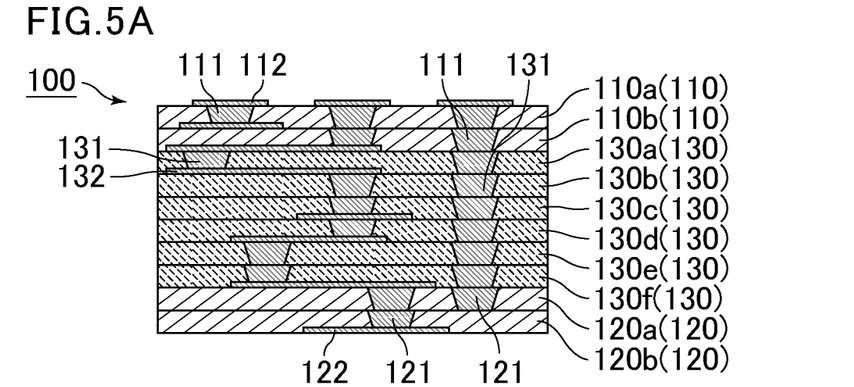
FIG. 5A, FIG. 5B, FIG. 5C, and FIG. 5D are each a cross-sectional view schematically showing a step in the method of producing a composite substrate of the present invention.

FIG. 5A is a cross-sectional view schematically showing an example of the laminate preparing step in the method of producing a composite substrate of the present invention.

In a laminate 100 before firing shown in FIG. 5A, two ceramic green sheets 120 (120a, 120b) are stacked at the bottom, two ceramic green sheets 110 (110a, 110b) are stacked at the top, and six cavity-forming sheets 130 (130a, 130b, 130c, 130d, 130e, 130f) are stacked between the ceramic green sheet 110b and the ceramic green sheet 120a.

The numbers of the ceramic green sheets and the cavity-forming sheets are not limited.

The ceramic green sheets 110 and the ceramic green sheets 120 are made of a raw ceramic material and contain metal conductor pastes 111 and 121 for interlayer connection, respectively. The cavity-forming sheets 130 are made of carbon used as the cavity-forming material and contain a metal conductor paste 131 for interlayer connection.

Also, lines (indicated by the reference signs 112, 122, and 132) are formed using a metal conductor paste. The lines encompass electrodes.

Such a stack of the ceramic green sheets and the cavity-forming sheets is thermocompression bonded, whereby a laminate before firing can be obtained.

In the laminate preparing step, the order of the processes performed is not limited as long as a laminate in which a cavity-forming sheet is sandwiched between ceramic green sheets can be obtained. Stacking of the sheets may not be after forming the slurry into a sheet shape. The build-up method may be employed in which the materials to be formed into the layers are stacked while being subjected to drilling, filling with a metal conductor paste, and printing.

The firing step is then performed.

In the firing step, the metal conductor paste in the ceramic green sheets and the metal conductor paste in the cavity-forming sheet are fired at a firing temperature equal to or higher than the sintering start temperatures of the metal conductor pastes, so that a substrate with a cavity is obtained.

The firing integrally sinters the metal conductor paste in the ceramic green sheets and the metal conductor paste in the cavity-forming sheet together to form metal conductors for interlayer connection. Also, the raw ceramic material is sintered into ceramic layers. In addition, the cavity-forming material burns off to form a cavity between the ceramic layers.

The firing step is described with reference to FIG. 5B.

Figure 5B:
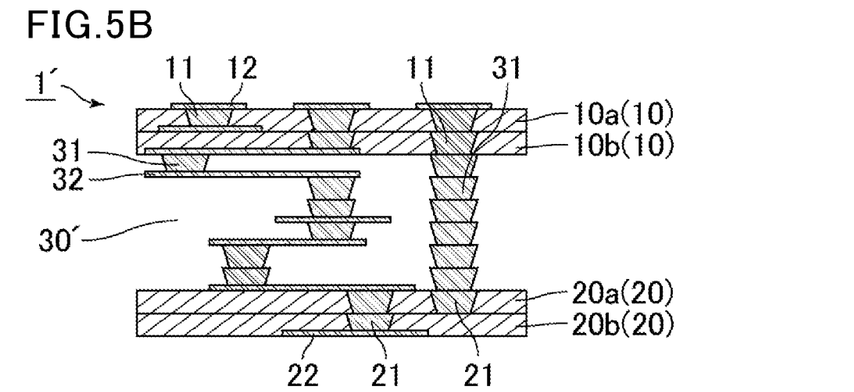

FIG. 5B is a cross-sectional view schematically showing an example of the firing step in the method of producing a composite substrate of the present invention.

In a substrate 1' after firing shown in FIG. 5B, the raw ceramic material in the ceramic green sheets 110 and 120, the metal conductor pastes 111 and 121 for interlayer connection, and the lines 112 and 122 formed using a metal conductor paste in FIG. 5A are sintered into ceramic materials, upper vias 11, lower vias 21, upper conductive lines 12, and lower conductive lines 22, respectively. Thereby, the upper ceramic layer 10 and the lower ceramic layer 20 are formed.

As for the portion where the cavity-forming sheet 130 is present in FIG. 5A, the metal conductor paste 131 for interlayer connection and the lines 132 formed using a metal conductor paste are sintered into middle vias 31 and middle conductive lines 32, respectively. Also, carbon as the cavity-forming material burns off to form a cavity 30' in the portion where the carbon was present. The thickness of the cavity 30' is determined according to the total thickness of the cavity-forming sheet(s). The sintered middle vias 31 and middle conductive lines 32 exhibit a strong junction to maintain the predetermined thickness of the cavity 30'.

The firing temperature in the firing step is not limited, and is typically preferably 800° C. or higher and 1000° C. or lower.

The firing atmosphere may be, but is not limited to, a normal air atmosphere or a hypoxic atmosphere, for example. The hypoxic atmosphere as used herein means an atmosphere in which the partial pressure of oxygen is lower than that in the normal air atmosphere. Examples thereof include inert gas atmospheres such as a nitrogen atmosphere or an argon atmosphere, an atmosphere in which an inert gas such as nitrogen is mixed with the atmospheric air, and a vacuum atmosphere. The firing atmosphere may also be a mixed atmosphere of nitrogen and hydrogen.

The firing step may include preparing a constraining layer-combined laminate having a structure in which a first constraining layer and a second constraining layer, each containing an inorganic material that is not substantially sintered at the firing temperature, are provided on the outermost main surfaces of the respective ceramic green sheets of the laminate before firing; and firing the constraining layer-combined laminate, thereby obtaining a substrate sandwiched between the first constraining layer and the second constraining layer after the firing.

The method described above utilizes the constraining layers to constrain the ceramic green sheets from shrinking in the firing. This allows the ceramic green sheets to shrink only in the thickness direction and substantially prevents shrinkage of the ceramic green sheets in the main surface directions, improving the dimensional accuracy of the resulting composite substrate.

The resin layer forming step is performed.

The resin layer forming step includes forming a middle resin layer between the upper ceramic layer and the lower ceramic layer and a side surface resin layer on at least one side surface of the substrate by immersing the substrate with a cavity obtained in the firing step in a liquid containing a resin material to cause the resin material to adhere to the cavity and the at least one side surface of the substrate, followed by curing the resin material.

The method of forming a middle resin layer used in the resin layer forming step includes preparing a liquid containing a resin material, immersing the substrate with a cavity in the liquid to impregnate the cavity with the resin material, and curing the resin material. When the cavity is impregnated with the resin material, the liquid containing a resin material is caused to adhere to at least one side surface of the substrate as well, so that a side surface resin layer that is integral with the middle resin layer can be formed on at least one side surface of the substrate.

The liquid containing a resin material may be the resin material itself in the form of liquid or may be a resin solution, emulsion, or latex obtained by mixing the resin material with a solvent. The liquid may also be a liquid having fluidity obtained by heating the resin material to the softening point thereof or higher. The liquid containing a resin material may contain additive(s) such as a plasticizer, a dispersant, and/or a curing agent as needed.

When the resin material is a curable resin such as a thermosetting resin or a photocurable resin, the resin material may be cured according to the curing conditions of the resin used. In the case of a thermoplastic resin, the resin material heated into a liquid having fluidity can be impregnated into the cavity, and then solidified by decreasing the temperature. Such a solidification process is also encompassed by the expression "curing the resin material" herein.

The resin layer forming step is described with reference to FIG. 5C and FIG. 5D.

Figure 5C:
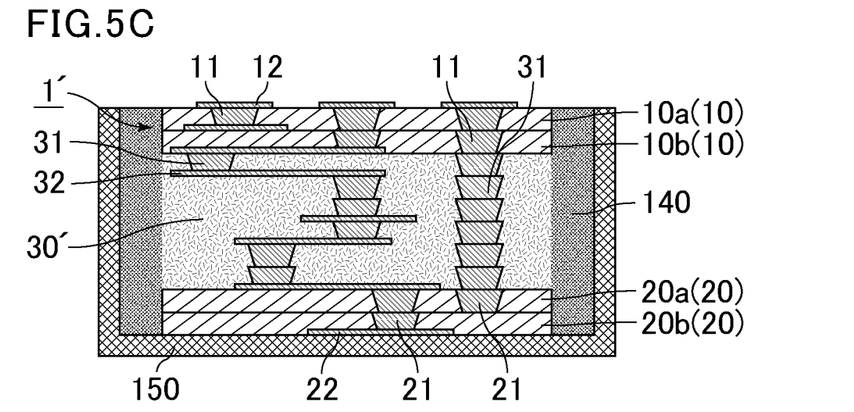

FIG. 5C is a cross-sectional view schematically showing an example of the resin layer forming step in the method of producing a composite substrate of the present invention. FIG. 5D is a cross-sectional view schematically showing an example of a composite substrate obtainable in the resin layer forming step.

In the resin layer forming step, as shown in FIG. 5C, the substrate 1' obtained in the firing step is placed in the recess of a mold 150. The recess can house the substrate 1' completely. Liquid 140 containing a resin material is then poured into the mold 150, so that the substrate 1' is immersed in the liquid 140 containing a resin material.

The substrate 1' is immersed in the liquid 140 containing a resin material to cause the resin material to adhere to the cavity 30' and the side surfaces of the substrate 1', and then the liquid 140 containing a resin material is cured.

Figure 5D:
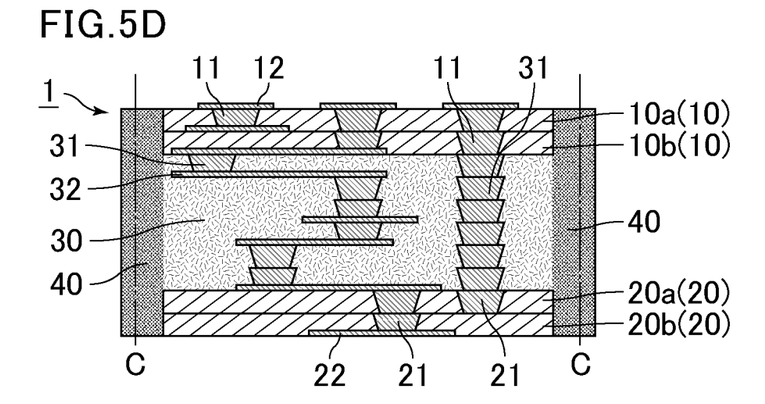

As shown in FIG. 5D, curing the resin material forms the resin material filling the cavity 30' (in FIG. 5C, the portion of the liquid 140 containing a resin material indicated by the light color) into the middle resin layer 30 and forms the resin material adhering to the side surfaces of the substrate 1' (in FIG. 5C, portions of the liquid 140 containing a resin material indicated by the dark color) into the side surface resin layer 40, whereby the composites substrate 1, which is an embodiment of the composite substrate of the present invention, can be produced.

The middle resin layer and the side surface resin layer can also be formed by injecting a resin material or a liquid containing a resin material into the cavity between the ceramic layers from a side thereof to be a side surface of the composite substrate.

Also, a middle resin layer containing a void-forming material and a side surface resin layer can be formed by mixing the resin material with the void-forming material. The void-forming material can be the hollow beads described above.

In addition, as needed, a Ni plating film or Au plating film may be formed on the electrodes formed on the surface of the composite substrate. Furthermore, electronic components or the like may be mounted on the electrodes.

The method of producing a composite substrate of the present invention may further include a side surface processing step of cutting part of the side surface resin layer in the thickness direction after the resin layer forming step.

FIG. 5D is also a cross-sectional view schematically showing an example of the side surface processing step.

In the side surface processing step, as shown in FIG. 5D, part of the side surface resin layer 40 of the composite substrate 1 obtained through the laminate preparing step, firing step, and resin layer forming step is cut in the thickness direction (along the dashed-dotted lines C in FIG. 5D).

Cutting part of the side surface resin layer in the thickness direction can shape the outline of the composite substrate.

EXAMPLES

Examples that more specifically disclose the composite substrate of the present invention and the method of producing a composite substrate of the present invention are described below. The present invention is not limited to these examples.

Example 1

Powder containing $SiO_2$, $Al_2O_3$, and $BaCO_3$ as a ceramic powder was wet mixed, pulverized, and dried, so that a mixture was obtained. The obtained mixture was heated to obtain raw material powder for a ceramic green sheet. To the raw material powder were added an organic binder, a dispersant, and a plasticizer, and the powder was then mixed and pulverized to produce a slurry. The obtained slurry was formed into a sheet shape on a base film by the doctor blade method and then dried, followed by adjusting the thickness of the sheet-shaped slurry to give a desired thickness after firing. Thereby, a ceramic green sheet was obtained.

Via holes were formed in the ceramic green sheet by laser, and the via holes were filled with a metal conductor paste. Also, using the metal conductor paste, lines were formed by screen printing. The metal conductor paste used contained copper as the metal material and the ceramic powder above. The proportion of copper in the metal conductor paste was determined such that the proportion of copper in the metal conductor after firing would be 40 wt %.

An organic binder, a dispersant, and a plasticizer were added to carbon, and they were mixed and pulverized to obtain a slurry. The obtained slurry was formed into a sheet shape on a base film by the doctor blade method, and then dried, followed by adjusting the thickness of the sheet-shaped slurry to give a desired thickness after firing. Thereby, a carbon sheet having a thickness of 30 µm was obtained.

Via holes were formed in the carbon sheet by laser, and the via holes were filled with the metal conductor paste. Also, using the metal conductor paste, lines were formed by screen printing. The metal conductor paste used was the same as that used for the ceramic green sheet.

As shown in FIG. 5A, two ceramic green sheets, six carbon sheets, and two ceramic green sheets were stacked and then thermocompression bonded, so that a laminate before firing was obtained.

This laminate was fired at 950° C. for one hour in a hypoxic atmosphere, whereby a substrate with a cavity (thickness: 180 µm) was obtained as shown in FIG. 5B.

The substrate was placed in the recess of a mold. The recess was slightly greater than the substrate in the top view and had the same depth as the substrate. A liquid containing a fluororesin with a tensile elastic modulus of 0.4 GPa as a resin material was injected into the mold from a side surface. The cavity of the substrate was impregnated with the liquid containing the fluororesin to cause the liquid containing the fluororesin to adhere to the side surfaces of the substrate. The liquid was then heated to cure the fluororesin into the middle resin layer and the side surface resin layer, so that a composite substrate of Example 1 was obtained.

In the composite substrate of Example 1, the thicknesses of the upper ceramic layer, the lower ceramic layer, and the middle resin layer were 60 µm, 60 µm, and 180 µm, respectively.

The thickness of the side surface resin layer was 30 µm.

Examples 2 and 3

A composite substrate was obtained by the same procedure as in Example 1 except that the thicknesses of the upper ceramic layer, the middle resin layer, and the lower ceramic layer were changed as shown in Table 1 by adjusting the thickness and number of ceramic green sheets and the thickness and number of carbon sheets as appropriate.

Comparative Example 1

A composite substrate of Comparative Example 1 was produced by the same method as in Example 1 except that no side surface resin layer was formed on the side surfaces of the substrate by injecting the liquid containing a resin material into only the cavity of the substrate without a mold unlike Example 1 and curing the resin material.

Comparative Example 2

A composite substrate of Comparative Example 2 was produced by applying the liquid containing a resin material used in Example 1 to the side surfaces of the composite substrate of Comparative Example 1 and heating the liquid to form a side surface resin layer. In the composite substrate of Comparative Example 2, the middle resin layer and the side surface resin layer were not integral.

(Drop Impact Test)

The composite substrates of the examples and the comparative examples were subjected to a drop impact test.

The drop impact test was performed in conformity with JEDEC JESD22-B111. Thirty composite substrates of each example were solder-mounted on a test board to form a daisy chain circuit. The board was dropped 100 times with an impact acceleration of 1500 G, 1.0 ms, and a half-sine impact waveform. The composite substrates were evaluated as poor when they had a defect such as an open circuit or a crack after the test, evaluated as good when they did not have a defect such as an open circuit or a crack after the test, and evaluated as excellent when they did not have a defect such as an open circuit or a crack after being dropped 300 times under the same conditions as above.

Table 1 summarizes the evaluation results.

(Heat Cycle Test)

The composite substrates of the examples and the comparative examples were subjected to the heat cycle test.

Thirty composite substrates of each example were solder-mounted on a test board to form a daisy chain circuit. The board was subjected to a cycle with a temperature of +85° C. to −40° C. and a retention time of 30 min for 400 times. The composite substrates were evaluated as poor when they had a defect such as an open circuit or a crack, and evaluated as good when they did not have a defect such as an open circuit or a crack.

Table 1 summarizes the evaluation results.

(Warpage Test)

The composite substrates after the heat cycle test were placed on a horizontal surface. The height from the horizontal surface to the end surface of each of the composite substrates was measured as warpage of the composite substrate of each example when the central portion of the composite substrate was in contact with the horizontal surface. The height from the horizontal surface to the center of the composite substrate was measured as warpage of the composite substrate of each example when the central portion of the composite substrate was not in contact with the horizontal surface. Table 1 shows the results.

Here, the height of the warpage was confirmed to have no influence on the results of the drop impact test and the heat cycle test.

TABLE 1

|  | Presence or absence of side surface resin layer | Integration of middle resin layer and side surface resin layer | Thickness of upper ceramic layer [%] | Thickness of middle resin layer [%] | Thickness of lower resin layer [%] | Evaluation ||| 
|---|---|---|---|---|---|---|---|---|
|  |  |  |  |  |  | Drop impact test | Heat cycle test | Warpage [mm] |
| Example 1 | Present | Integrated | 20 | 60 | 20 | Good | Good | 0.05 |
| Example 2 | Present | Integrated | 20 | 40 | 40 | Good | Good | 0.2 |
| Example 3 | Present | Integrated | 10 | 30 | 60 | Good | Good | 2 |
| Comparative Example 1 | Absent | N/A | 20 | 60 | 20 | Poor | Poor | 0.05 |
| Comparative Example 2 | Present | Non-integrated | 20 | 60 | 20 | Poor | Poor | 0.05 |

The results show that no peeling occurred between the ceramic layers and the middle resin layer in the composite substrates of the examples in which the side surface resin layer was formed. In contrast, in the composite substrate of Comparative Example 1 in which no side surface resin layer was formed on the side surfaces and in the composite substrate of Comparative Example 2 in which the side surface resin layer was not integral with the middle resin layer, peeling tended to occur between the ceramic layers and the middle resin due to the drop impact or thermal shock.

Also, the results of Examples 1 to 3 show that bringing the thickness of the upper ceramic layer and the thickness of the lower ceramic layer closer to each other can reduce or prevent warpage of the composite substrate.

REFERENCE SIGNS LIST 1, 2, 3 composite substrate
1' substrate
10, 10a, 10b upper ceramic layer
11 upper via
12 upper conductive line
20, 20a, 20b lower ceramic layer
21 lower via
22 lower conductive line
30 middle resin layer
30' cavity
31 middle via
32 middle conductive line
40 side surface resin layer
50a, 50b, 50c strut structure
51a, 51b, 52b, 51c support
60 surface resin layer
100 laminate
110, 110a, 110b ceramic green sheet
111, 121, 131 metal conductor paste for interlayer connection
112, 122, 132 line formed using metal conductor paste
120, 120a, 120b ceramic green sheet
130, 130a, 130b, 130c, 130d, 130e, 130f cavity-forming sheet
140 liquid containing resin material
150 mold

The invention claimed is:

1. A composite substrate comprising:
an upper ceramic layer;
a lower ceramic layer;
a middle resin layer between the upper ceramic layer and the lower ceramic layer; and
a side surface resin layer on an entirety of all side surfaces of the composite substrate, wherein
a thickness of the side surface resin layer is from 20 to 100 μm, and
the middle resin layer and the side surface resin layer are integral resin layers.

2. The composite substrate according to claim 1, wherein the upper ceramic layer includes an upper conductive line and an upper via,
the lower ceramic layer includes a lower conductive line and a lower via,
the middle resin layer includes a middle conductive line and a middle via, and
the upper conductive line, the upper via, the lower conductive line, the lower via, the middle conductive line, and the middle via are joined together.

3. The composite substrate according to claim 2, wherein the middle conductive line comprises lines in multiple layers.

4. The composite substrate according to claim 2,
wherein the middle resin layer includes a strut structure connecting the upper ceramic layer and the lower ceramic layer, and
the strut structure includes the middle via and an insulating columnar support extending in a thickness direction of the middle resin layer.

5. The composite substrate according to claim 2, further comprising an insulating strut structure in the middle resin layer, the insulating strut structure including insulating supports that connect the upper ceramic layer to the lower ceramic layer either directly or in conjunction with the middle conductive line and/or the middle via.

6. The composite substrate according to claim 1, wherein a thickness of each of the upper ceramic layer and the lower ceramic layer is less than 50% of a thickness of the composite substrate.

7. The composite substrate according to claim 1, wherein a thickness of the middle resin layer is greater than a total thickness of the upper ceramic layer and the lower ceramic layer.

8. The composite substrate according to claim 1, wherein a thickness of the upper ceramic layer and a thickness of the lower ceramic layer are the same.

9. The composite substrate according to claim 1, wherein the middle resin layer is made of a resin material selected from fluororesins, silicone rubbers, hydrocarbon resins, polyethylenes, polypropylenes, polystyrenes, polyimide-based resins, polyether ketone-based resins, polyphenylene sulfide-based resins, and cycloolefin-based resins.

10. The composite substrate according to claim 1, wherein the middle resin layer has a relative permittivity $\varepsilon_r$ of 1.5 to 3.

11. The composite substrate according to claim 1, wherein the middle resin layer has a tensile elastic modulus of 0.02 GPa to 3 GPa.

12. The composite substrate according to claim 1, further comprising a bottom surface resin layer on a surface of the lower ceramic layer not in contact with the middle resin layer, and the bottom surface resin layer is integral with the side surface resin layer and the middle resin layer.

13. The composite substrate according to claim 1, wherein the middle resin layer and the side surface resin layer are made of the same type of resin.

\* \* \* \* \*